(12) United States Patent
Hameed et al.

(10) Patent No.: US 11,994,635 B2
(45) Date of Patent: May 28, 2024

(54) MEMS NANOTUBE BASED THERMAL NEUTRON DETECTOR

(71) Applicant: The United States of America, as represented by the Secretary of the Navy, Arlington, VA (US)

(72) Inventors: Zishan Hameed, Norfolk, VA (US); John Gats, Seattle, WA (US); Jin-Woo Han, San Jose, CA (US); Meyya Meyyappan, San Jose, CA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 227 days.

(21) Appl. No.: 17/233,441

(22) Filed: Apr. 17, 2021

(65) Prior Publication Data

US 2021/0325553 A1    Oct. 21, 2021

Related U.S. Application Data

(60) Provisional application No. 63/011,444, filed on Apr. 17, 2020.

(51) Int. Cl.
*G01T 3/08* (2006.01)
*B81B 7/00* (2006.01)
*B82Y 30/00* (2011.01)

(52) U.S. Cl.
CPC .............. *G01T 3/08* (2013.01); *B81B 7/0058* (2013.01); *B81B 2201/031* (2013.01); *B81B 2203/04* (2013.01); *B82Y 30/00* (2013.01)

(58) Field of Classification Search
CPC .... G01T 3/08; B81B 7/0058; B81B 2201/031
See application file for complete search history.

(56) References Cited

U.S. PATENT DOCUMENTS

| | | | | |
|---|---|---|---|---|
| 2004/0119591 A1* | 6/2004 | Peeters | ............... | G08B 21/0222 |
| | | | | 977/957 |
| 2010/0301196 A1* | 12/2010 | Chu | .................... | G01V 5/0091 |
| | | | | 977/750 |
| 2011/0081724 A1* | 4/2011 | Swager | ................. | B82Y 15/00 |
| | | | | 977/773 |
| 2011/0192016 A1* | 8/2011 | Kang | ................. | H10N 30/1061 |
| | | | | 252/62.9 R |
| 2012/0238021 A1* | 9/2012 | Hashim | ............... | B01J 20/0248 |
| | | | | 423/276 |
| 2017/0352606 A1* | 12/2017 | Whitney | ................ | B82Y 30/00 |
| 2018/0057359 A1* | 3/2018 | Patel | .................... | C23C 14/228 |
| 2018/0348384 A1* | 12/2018 | Jordan | .................... | G01T 3/008 |
| 2019/0257959 A1* | 8/2019 | Thirimanne | .......... | B82Y 30/00 |
| 2020/0357979 A1* | 11/2020 | Kim | .................... | H10N 30/077 |

* cited by examiner

*Primary Examiner* — Hugh Maupin
(74) *Attorney, Agent, or Firm* — Naval Postgraduate School; Scott Bell (57) ABSTRACT

A MEMS nanotube based radiation sensor that is low cost, low power, compact, reliable and is applicable across many fields and a method for fabricating such a sensor are described. Each sensor may be connected to an array of similar but distinct sensors that leverage different materials and nanotube technology to detect radiation.

11 Claims, 6 Drawing Sheets

MEMS NANOTUBE BASED THERMAL NEUTRON DETECTOR

CROSS-REFERENCE TO RELATED APPLICATIONS

This patent application is a non-provisional of and claims the benefit of U.S. Provisional application 63/011,444, filed Apr. 17, 2020, which is hereby incorporated by reference in its entirety.

BACKGROUND OF THE INVENTION

1. Field of the Invention

The present invention relates generally to microelectromechanical systems (MEMS), particularly nanotube based radiation detectors and their fabrication method.

2. Description of the Related Art

The use of radiation-producing technologies has increased over time, so has the need to create more powerful and effective detectors. Radiation detection, as both a scientific and engineering endeavor has evolved over the years into a diverse field with many applications. As the knowledge and capabilities surrounding radiation and its classification have increased, detectors have grown from the ability to merely detect the presence of radiation to the ability to categorize and quantify it. The global market for radiation detection, monitoring, and safety market is an increasing one, driven by security concerns, expansion of radiation use in medicine, and increased cognizance of individuals working in environments with radiation exposure.

Radiation, at its most basic level, is traveling energy in the form of electromagnetic waves or energetic particles. Radiation originating from nuclear sources is further divided into one of two categories: charged particulate radiation or uncharged radiation. Charged particulate radiation typically refers to products of beta-type decay or alpha-type decay, either electrons or heavy charged particles. Uncharged radiation can be energetic neutrons or electromagnetic radiation. The radiation types may differ in mass, energy and how deeply they penetrate people and objects and are thus relevant across many fields. For example, neutron radiation is relevant in the fields of homeland security, space operations, distributed sensor networks, etc. Current detection techniques for neutron radiation, such as radiation portal monitors, are large, expensive, hard to maintain and thus not feasible to employ on a large scale. Gamma radiation is applicable to fields such as nuclear medicine, radiation physics or dosimetry, and health physics. Current detection techniques for gamma radiation, such as thermoluminescent dosimetry, require accumulated damage and therefore do not provide in situ measurements.

MEMS, metal-oxide-semiconductor field-effect transistor, and other solid-state sensors and detection systems provide varying levels of detection, but none provides the ability for low-medium, and high dose in situ detection of radiation.

SUMMARY OF THE INVENTION

Embodiments in accordance with the invention provide a MEMS nanotube based radiation sensor that is low cost, low power, compact, reliable and is applicable across many fields. Each sensor may be connected to an array of similar but distinct sensors that leverage different materials and nanotube technology to detect radiation.

In an embodiment, a sensor is provided. The sensor includes a first electrode and a second electrode, on which a nanotube layer is deposited. The nanotube layer includes a first nanotube type configured to provide an electrical pathway between the electrodes, and a second nanotube type configured to detect radiation.

In another embodiment, a method for fabricating a sensor for detecting radiation is provided. The method includes forming a first electrode and a second electrode. The method further includes depositing a nanotube layer on the first electrode and the second electrode.

In yet another embodiment, a radiation detector system is provided. The system includes a first sensor configured to detect a first type of radiation. The sensor includes a first and second electrodes, on which a nanotube layer is deposited.

Embodiments in accordance with the invention are best understood by reference to the following detailed description when read in conjunction with the accompanying drawings.

Embodiments in accordance with the invention are further described herein with reference to the drawings.

DETAILED DESCRIPTION OF THE INVENTION

1. Overview

An electronic nose works similarly to the mammalian olfactory system. The human nose is capable of discriminating upward of 10,000 smells using only about 400 receptors. The nose works together with the brain to accomplish this by breaking down smells into specific elements, which are detected in the nose and subsequently quantified by olfactory sensory neurons in the brain. The neurons send this information to the brain, where the signals are recombined and identified by tapping into one's memory and experience. In an electronic nose system, the nose receptors and olfactory sensory neurons are replaced with a multisensory array and the brain is replaced by processing units and algorithms trained to recognize specific sources of radiation through the detection of its constituent parts.

MEMS is a process technology that may be utilized to create small, compact integrated devices or systems that combine mechanical and electrical components. Such devices or systems may be fabricated using integrated circuit batch processing techniques to integrate the mechanical and electrical components onto the same chip. While these devices/systems are designed to sense, control and actuate on the micro scale, they can generate effects on the macro scale.

Embodiments described herein leverage the changing properties of various materials when exposed to radiation to detect radiation. Examples are directed to nanotube based sensors that utilize carbon nanotubes (CNTs) as a conductor and boron nitride nanotubes (BNNTs) as a neutron absorber to detect neutron radiation. However, other types of nanotube or materials may be used to detect neutron radiation, as well as other types of radiation, such as alpha, beta and gamma.

Embodiments described herein provide compact, low power, low cost, versatile radiation sensors and radiation detector systems that can detect a wide range of radiation types and doses. The MEMS process utilized to create the sensors and the materials used as detection media are replicable at a large scale. Therefore, the sensors may be replicated easily at a low cost and may be disposable. The ability to connect multiple sensors with different detection medium to the same processor provides additional benefits. For example, a detector system that receives and processes multiple inputs simultaneously may act as its own verification system by confirming results between all of its connected sensors. The detection materials may be expanded to detect all forms of radiation, and a source of radiation may be identified through referencing a library or lookup

2. Neutron Radiation Properties and Interaction with Matter

A neutron is an electrically neutral particle, so it possesses the ability to move unimpeded through areas of densely packed charged particles, including an atomic nucleus. This makes the neutron a prime candidate for the introduction of energy into an unstable nucleus. Fissionable sources are those that accept an energetic neutron into their nucleus in order to undergo fission, the high-energy splitting of the atom. That is, fission is a nuclear decay process in which an energetically unstable nucleus of an atom splits into multiple parts and emits neutrons and other radiation products.

The unique probability of an element interacting with an incident neutron, based on its energy level and its geometrical configuration, is referred to as the nuclear cross section. Nuclear cross section is specifically the quantification of the interaction probability of a particular nuclear reaction under particular conditions. Nuclear cross sections are most commonly reported in units of $10^{-24}$ cm$^2$, known as "barns," and the cross sections refer specifically to the probabilities of the four fundamental neutron interactions between emitted neutrons and the surrounding nuclei: elastic scattering, inelastic scattering, neutron absorption, and radiation capture. Another crucial element of nuclear cross section relates to the energy of the incoming particle. The radiative capture reaction in particular is very sensitive to the energy of the incoming particle. Nuclei undergo this reaction more frequently for particular energies of incumbent radiation, and so are "tuned" to these particular energy levels. This property of a nucleus is referred to as "nuclear resonance."

Boron-10, an isotope of natural boron, is a useful element for neutron detection due to its ready availability and high neutron absorption (or radiative capture) cross section. Natural boron exists normally at roughly 80% boron-11, and 20% boron-10, but for neutrons in the thermal energy regime (approximately 0.025 electronvolt (eV)), the radiative capture reaction of boron-10 is roughly 3840 barns, which is nearly five times greater than that of natural boron, which is 790 barns.

Neutrons can be absorbed in several different reactions including (n, γ), (n,α), (n,2n), (n,p), etc. While the term "radiative capture" most commonly refers to the (n, γ) reaction. Embodiments described herein are directed to boron as a neutron absorber, thus the (n,α) is relevant. In this process, a nucleus absorbs an incident neutron and temporarily forms a "compound" nucleus. The newly formed compound nucleus then decays to its ground state via the emission of gamma radiation, similar to the reaction described in Equation 1. The capture boron-10 (n,α) reaction is represented for boron-10 in equations 1 and 2 for an incoming thermal neutron, n:

$$_5^{10}B + _0^1n \rightarrow _3^7Li + _2^4\alpha (6\%) \quad (1)$$

$$_5^{10}B + _0^1n \rightarrow _3^7Li' + _2^4\alpha (94\%) \quad (2)$$

where Li' represents a lithium atom in its excited state. The high-energy products of the (n,α) reaction and their specific contribution to neutron detection will be described further in reference to the subsection entitled "Nanotubes as Resistors."

The capture of the neutron and subsequent emission of an α particle, among other products, is the reason for the "(n,α)" nomenclature. This reaction is prompt, and yields a total product energy on the order of 2 MeV. In the 94% probability case, the resultant lithium atom begins in its excited state. It then promptly decays to its ground state on a time scale of roughly $10^{-13}$ seconds by emitting a 0.48 MeV gamma ray. Using the conservation of momentum principle, the resulting energies of the lithium atom and α particle may be determined. Since the incoming neutron energy is only 0.025 eV, its initial momentum contribution is negligible. For the same reason, it is assumed that the α particle and lithium atom are emitted from the boron nucleus in opposite directions. The kinetic energies of the products may be found by solving the following two equations simultaneously (for the 94% case):

$$E_{Li} + E_\alpha = 2.31 \text{ MeV} \quad (3)$$

$$\sqrt{2m_{Li}E_{Li}} = \sqrt{2m_\alpha E_\alpha} \quad (4)$$

The simultaneous solution of the equations yields energies of 0.84 MeV and 1.47 MeV of the lithium atom and α particle, respectively.

3. Nanotubes for Neutron Sensing

A successful electronic nose or detector system or network may be built using suitable materials as the "receptors" that will produce a clear and measured response to radiation exposure. Individual materials do not typically excel in specifically categorizing all types of radiation simultaneously. By selecting a group of appropriate materials, the electronic nose may be built with limited receptors, each with measurable and distinct responses to different types of radiation. Since radiation sources have unique signatures in each form of radiation, selecting the appropriate materials to collect data separately yet simultaneously on each radiation type may yield a clear picture of the source by categorizing the full radiation spectrum produced. There are many materials being used and developed for neutron detection. Embodiments of the detector systems may take advantage of the unique applications of multiple materials while mitigating their disadvantages through the collaborative effort of the materials working in unison.

A resistive sensor may take advantage of microfabrication techniques and nanotube properties, such as those of CNTs and BNNTs. In an embodiment, a single sensor may combine the two types of nanotubes, CNTs and BNNTs, to form a resistive sensor.

The advent of single walled carbon nanotubes (SWCNT) in the 1990s began a new arena of nanomaterial science. The structure of a CNT may be pictured by imagining a graphene structure of sp2 hybridized carbon atoms rolled onto itself and capped at the ends with hemi-fullerenes. The lattice typically represents a uniform hexagonal pattern along the nanotube, with a staggering army of possible variations in the morphology to amplify various aspects of the nanotube's performance. These variations involve, but not limited to chirality, helicity, tube diameter, introduction of detects in the lattice, and many types of doping. In embodiments, sensors may rely on the electrical properties of CNTs, and thus the variations that affect those electrical properties, namely the resistance.

The layered SWCNTs that may be utilized in sensor embodiments are a semiconducting graphene structure with a direct band gap on the order of 1 eV. The small band gap is important because the low energy required to promote an electron to the conduction band will potentially enable faster and more accurate detection of radiation by allowing current to more readily travel through the CNTs. The 1 eV band gap is not exact due to the non-trivial calculation of the intertube spacing of the nanotube bundle. The spacing is small enough that individual nanotubes are affected by the potential of neighboring tubes. In an embodiment where the physical structure of the nanotubes has no chirality or helicity, and an average tube diameter of approximately 1 nanometer (nm), the band gap may be approximated as about 1 eV.

BNNTs are structurally similar to CNTs in their hexagonal lattice and design. Boron and nitrogen atoms occupy lattice sites in an alternating pattern along the nanotube. This alteration of boron and nitrogen as well as the more restrained morphology of the BNNTs (typically only hexagonal or rhomboidal) are due to energetic constraints on the configuration.

As described above, the use of isotopically pure boron-10 may be better than naturally occurring boron because of the high nuclear cross section of boron-10. In an embodiment, boron-10 BNNTs of the hexagonal morphology may be utilized for an embodiment due to their ease of procurement and their decay products that result from neutron radiation, shown in equations 1 and 2. Unlike SWCNTs, BNNTs have a large band gap that does not permit the flow of electrons, and thus the electrical properties of BNNTs may not be useful in the sensors. Instead, BNNTs may be used in nanotube form so that they may be easily mixed with the CNTs that provide the electrical pathways for a resistive sensor, in an embodiment.

4. Nanotubes as Resistors

Nanotubes obey the basic properties of electrical resistance as macro materials in that the resistance is characterized by ease of movement of charge through a medium. This movement of charge in semiconductor SWCNTs is accomplished through the promotion of electrons from the valence band to the conduction band of the material in the presence of an electric field. As described above, the SWCNTs' roughly 1 eV band gap provides a relatively easy promotion of electrons from their valance band to their conductance band. BNNTs, with their larger band gaps of about 5 eV, are closer to the regime of an insulator, severely restricting the movement of charge through their walls.

In an embodiment, in order to capitalize on the nuclear cross section of the BNNTs and the conduction properties of the CNTs, the detection mechanism (BNNTs) for the neutron sensor may be designed as a type of solid-state scintillator. Neutron irradiation may cause the boron-10 in the BNNTs to undergo the neutron capture reactions in equations 1 and 2, leading to the release of the high-energy lithium and α particles. The carbon-carbon (C—C) bonds that form the electric structure of the CNT resistor typically have bond strengths on the order of 3.6-3.9 eV. Therefore, the high-energy products (0.84 MeV lithium atom and 1.47 MeV α particle) from the boron-10 (n,α) capture reaction may destroy many of the C—C bonds with which they interact. This may create defect sites in the SWCNTs, inhibiting the flow of electrons and thus increasing the resistance of the SWCNTs.

5. Example Embodiments

Figure 1:
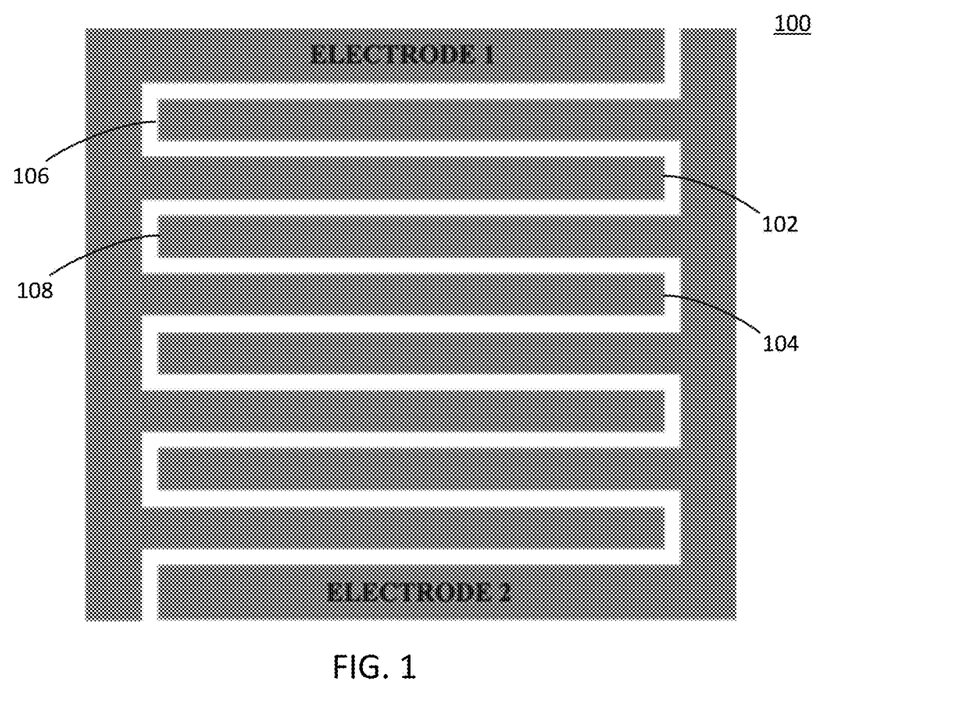
FIG. 1 is a schematic of a sensor that has an interdigitated design, in accordance with an example embodiment.

FIG. 1 is a schematic of a sensor 100 that has an interdigitated design, in accordance with an example embodiment. The interdigitated design takes advantage of a large electrode surface area while using only two electrodes, shown in FIG. 1 as electrode 1 and electrode 2, placed adjacent to an insulating substrate. Electrode 1 may include multiple fingers, such as finger 102, and finger 104 shown in FIG. 1. Similarly, electrode 2 may include multiple fingers, such as finger 106, and finger 108 shown in FIG. 1. The interdigitated design allows for one independent resistance measurement, but all resistance paths available are used in that measurement.

Other sensor designs are possible. For example, another sensor design may include a plurality of metal pads and contacts layered onto an insulating substrate and connected to independent wires that lead to the middle of the chip. In this embodiment, unique paths between the 16 pads may be formed by sequentially applying an electric potential drop across the pads compared to a reference resistor in a voltage bridge. The 16-pad sensor yields 120 independent resistance paths as determined by $\Sigma_{j=1}^{n-1} n$, where n is the total number of pads on the sensor chip. By including all possible paths between the pads, the chance of detecting a change on one of the many paths increases, but the chance of a large response decreases based on attempting to detect the change individually instead of as a whole.

Regardless of the sensor design, each sensor chip may be fabricated using typical chip fabrication technologies. In embodiments, resistive sensors may be made by printing electrodes on an insulating substrate with conductive ink.

The steps above are intended to be illustrative of the sensor chip fabrication process and are not intended to be limiting. In embodiments, other resources (e.g., materials, solutions, process, equipment and/or tools) may be used instead or in addition to the ones listed above. Furthermore, settings (e.g., time periods, machine settings, temperature settings, etc.) in each step may change, for example, based on the sensor design, electrode placement, or resources utilized.

Figure 2:
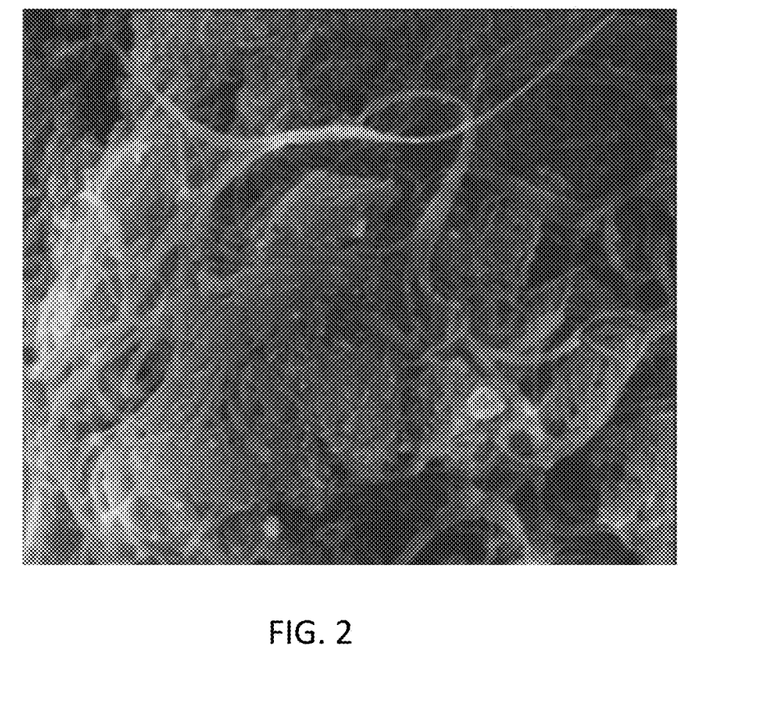
FIG. 2 illustrates a scanning electron microscope micrograph of a group of CNTs.

Returning to FIG. 1, an electrical connection may be established between the two electrodes by a layer of nanotubes being deposited on top of the electrodes and bridging the gaps across the multiple fingers. For example, FIG. 2 illustrates a scanning electron microscope (SEM) micrograph of a group of CNTs. In FIG. 2, strands of carbon that may be used as the resistive structure are shown.

Figure 3:
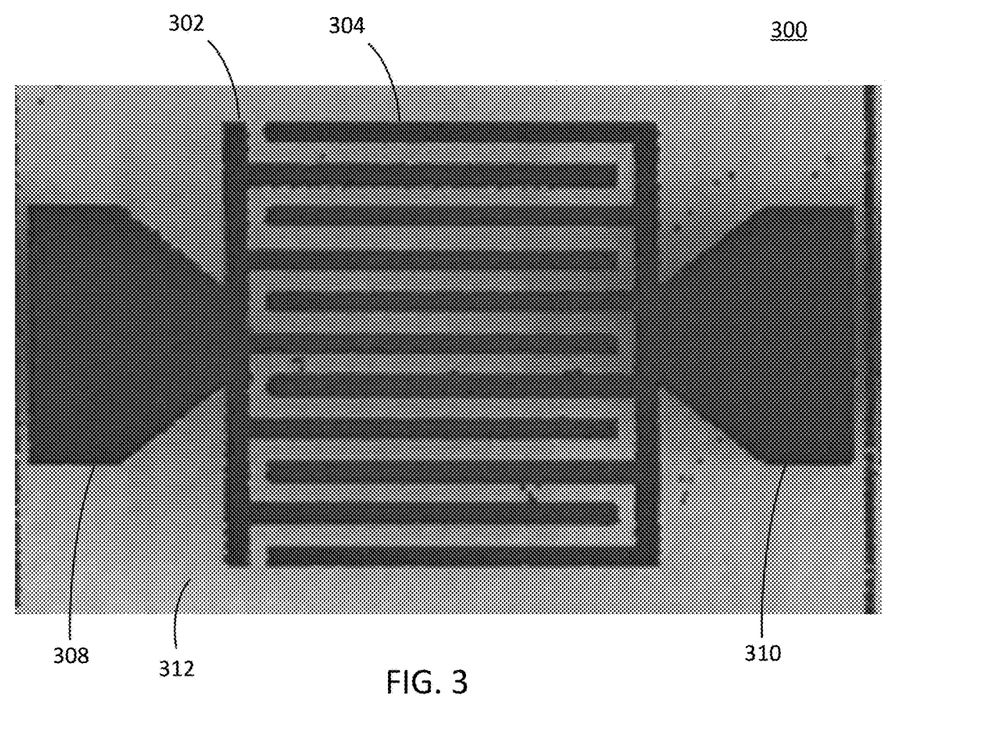
FIG. 3 illustrates an interdigitated sensor built on a substrate, in accordance with an example embodiment.

FIG. 3 illustrates an interdigitated sensor 300 built on a substrate, in accordance with an example embodiment. As shown in FIG. 3, sensor 300 includes first electrode 302 with conductive pad 308, and second electrode 304 with conductive pad 310 built on top of a flexible substrate 312. In an embodiment, the resistance across electrode 302 and electrode 304 may be measured using an instrument (e.g., multimeter) and conductive pad 308 and conductive pad 310 may serve as test pads for the probe(s). After sensor chip 300 is built (e.g., printing conductive electrodes on an insulating substrate), a mixture of semiconducting CNTs and enriched boron-10 nanotubes may be applied to sensor chip 300.

Figure 4:
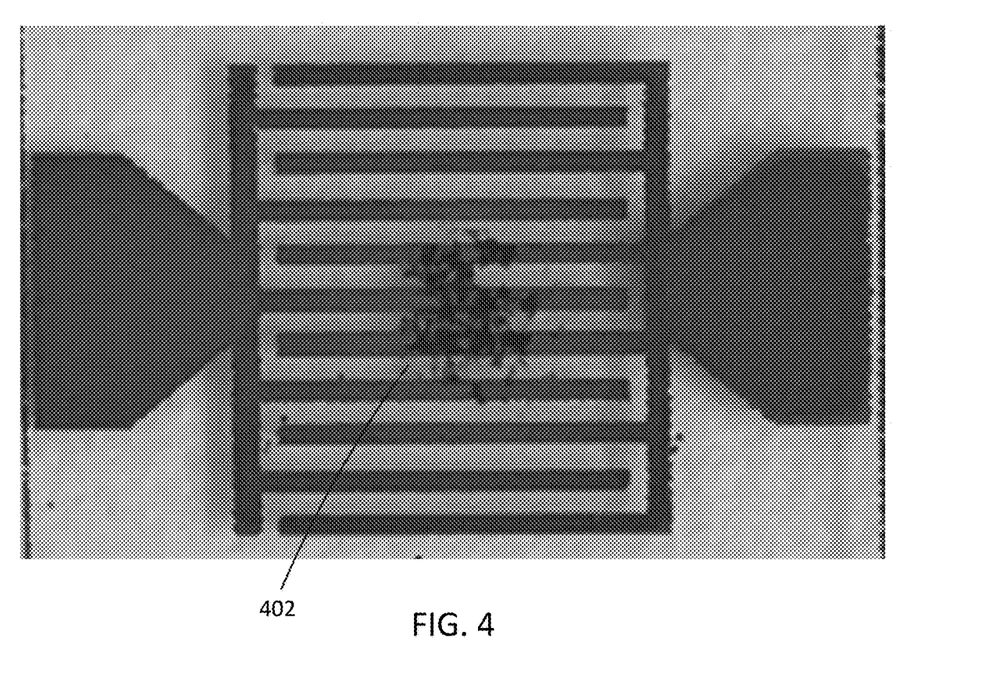
FIG. 4 illustrates the sensor of FIG. 3 with a layer of CNTs/BNNTs applied in the middle of the sensor, in accordance with an example embodiment.

FIG. 4 illustrates the sensor of FIG. 3 with a layer of CNT and BNNT applied in the middle of the sensor, in accordance with an example embodiment. As shown in FIG. 4, the CNTs are conspicuously shown in the middle of the sensor, and although BNNTs are also in the solution, their white color and relatively thin walls made them transparent when mixed with the CNTs. The placement of the nanotube layer does not have to be in the middle of the sensor. As long as there is a relatively uniform layer of nanotubes to bridge the gap between the electrodes to form sufficient electrical pathway (s), the exact location of the CNT and BNNT may not have a significant impact on the radiation detection.

Figure 5:
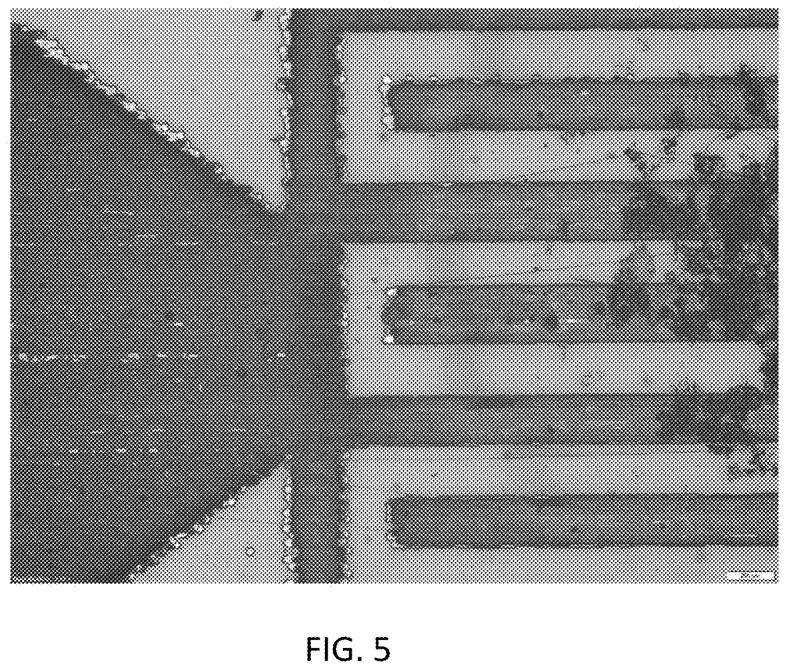
FIG. 5 illustrates an enlarged view of a portion of a sensor that includes a mixture of CNTs/BNNTs, in accordance with an example embodiment.

FIG. 5 illustrates an enlarged view of a portion of a sensor that has a mixture of CNT and BNNT deposited on it, in accordance with an example embodiment. The CNTs are configured to form an electrical connection or bridge between the electrodes, and BNNTs are configured to be the neutron detection medium.

BNNTs may be available as long strands of nanotubes loosely bound together that resemble a group of cotton balls. Any technique may be utilized to convert this form of BNNTs into a usable solution. For example, the BNNTs may be placed in a vessel with water, and an ultrasonic probe may be inserted into the vessel to disperse the BNNTs into the solution by means of vibration (e.g., one second on/off pulse continuously for 20 minutes). In an embodiment, 4.4 milligrams (mg) of BNNTs may be used with 10 milliliter (mL) of deionized water.

As another example, BNNTs may be placed in a vessel with nitric acid. The mixture may also undergo a sonication technique, as in the above example. In an embodiment, 15 mg of BNNTs may be used with 15 mL of nitric acid. The sonication technique may take about 60 minutes. Then, a 150-minute reduction reaction at 130° C. may follow using a recovery pipette. The nitric acid may be separated from the BNNTs by spinning the vessel in a centrifuge for a short period of time (e.g., 4000 RPM for 5 minutes). Demineralized water may be added back into the vessel to make a new solution after nitric acid separation.

Once the BNNTs are in the aqueous solution, semiconducting CNTs may be added and the liquid mixture of BNNTs and CNTs may be applied to a resistive sensor, such as sensor 300 shown in FIG. 3. In an embodiment, a combined CNT/BNNT solution may be created by mixing semiconducting CNTs and enriched BNNTs in water at a ratio of 1 mg/mL (BNNT) and 0.1 mg/mL (CNT). Other ratios may be suitable, depending on one or more factors, such as sensor design, electrode configuration, application of sensor, desired sensitivity and/or false alarm rate, etc. In an embodiment, BNNTs are configured to be higher in concentration than CNTs to increase the chance of reaction with the neutrons. That is, the more BNNTs there are, the more likely they are to absorb neutrons and emit $\alpha$ particles. Thus, the BNNTs may be weighted more than the CNTs in the mixture. In an embodiment, an adequate amount of CNTs includes a high enough concentration of CNT to have enough carbon to form the electrical bridge between the electrodes.

The CNTs/BNNTs mixture may be deposited onto electrodes of a sensor (e.g., sensor 300 shown in FIG. 3) in any manner. For example, the mixture may be deposited using a pipette or a machine configured to deposit the mixture to form a relatively uniform layer of CNTs/BNNTs on the electrodes when dried. In an embodiment, a minimally thick (e.g., less than or equal to 0.05 mm in height) layer of CNTs/BNNTs may be deposited on the electrodes. High mounds (e.g., 0.3 mm in height) of nanotubes on the electrodes may allow nuclear interactions to occur only in the uppermost layers of the sensor, thereby not allowing the reaction products to reach the CNTs lower on the sensor. Thus, the bottom layer—the CNTs that are responsible for the electrical path between the electrodes—are left unchanged. Accordingly, better detection results may be achieved when high mounds of nanotubes are avoided.

The neutron sensor may be sensitive to light while temperature and humidity seem to have little effect on the sensor. That is, the neutron sensor may respond to light by decreasing the resistance measured across the two electrodes. This may be due to the fact that CNTs may be used as infrared (IR) light detectors. Thus, a housing configured to protect the sensor or components thereof from light may be utilized. Such a housing may include materials (e.g., paper-based materials) that would shield the sensor from ambient light, but not impede the detection of neutron radiation. Alternatively or in addition, a light sensor or some means (e.g., photodetecting diode) of light detection may be used to collect data on light intensity to account for the light condition surrounding the sensor when determining the resistance measurement across the electrodes.

Figure 6:
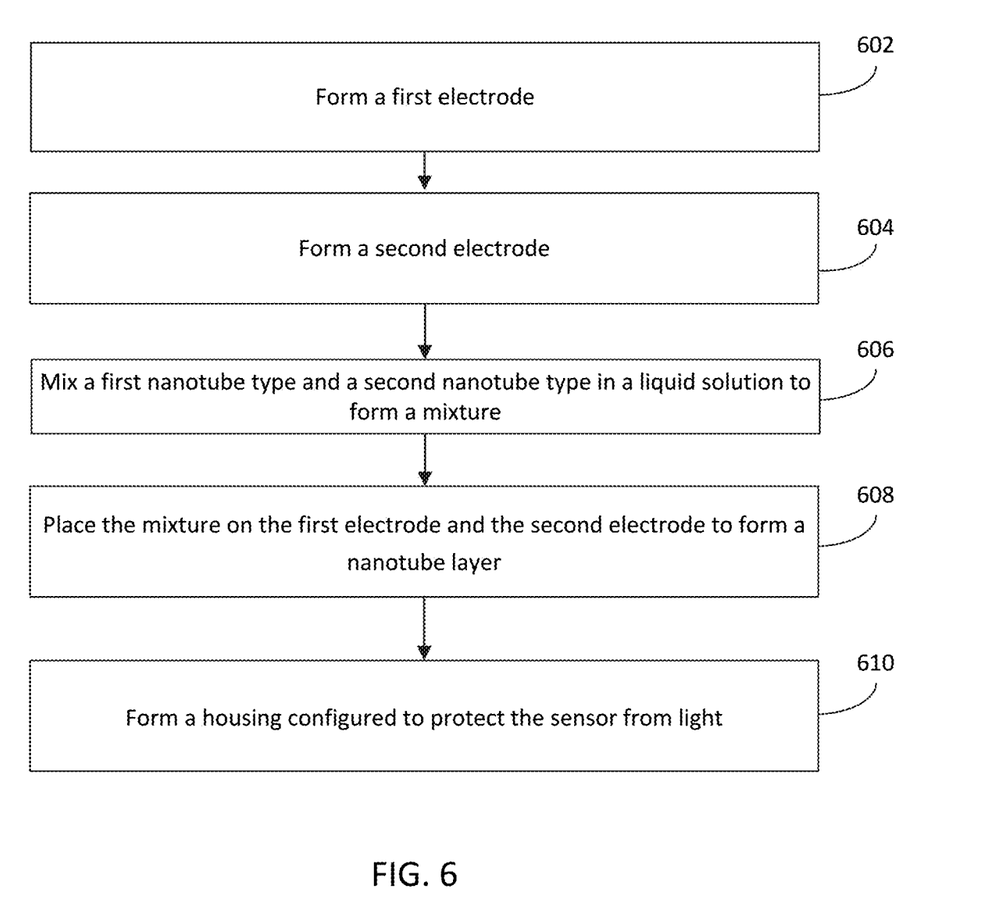
FIG. 6 illustrates a process flow diagram for a method of fabricating a sensor for detecting radiation, in accordance with an example embodiment.

FIG. 6 illustrates one embodiment of a process flow diagram for a method of fabricating a sensor for detecting radiation. Referring now to FIG. 6 together with FIGS. 1-5, in step 602, a first electrode is formed. For example, as shown in FIG. 1, electrode 1 is formed. In step 604, a second electrode is formed. Also shown in FIG. 2, electrode 2 may be formed adjacent to electrode 1, but the first electrode is not connected to the second electrode. The electrodes may be formed using any suitable deposition methods (e.g., thick-film technology) and equipment. The electrodes maybe formed of any conductive material, such as aluminum, platinum, gold and other metals. The electrodes may be formed on an insulating substrate, such as a plastic or silicon based substrate. The substrate may be a flexible substrate. In an embodiment, the first and second electrodes may be screen-printed on a substrate with conductive ink.

In step 606, a first nanotube type is mixed with a second nanotube type in a liquid solution to form a mixture. For example, as described above, CNTs and BNNTs in solid form may be dispersed in a liquid solution (e.g., water, isopropanol, nitric acid) in any manner, such as by vibration or sonication. CNTs and BNNTs may be formed in separate liquid solutions and then mixed together or they may be dispersed in the same liquid solution to form a mixture. For example, a combined CNT/BNNT solution may be created by mixing semiconducting CNTs and BNNTs in water at a ratio of 1 mg/mL (BNNT) and 0.1 mg/mL (CNT). In an embodiment, enriched (boron-10) BNNTs may be used for their high neutron absorption cross section. In another embodiment, other types of materials or nanotubes may be used in addition to or in place of CNTs and/or BNNTs with similar or different ratios.

In step 608, the mixture is placed on the first electrode and the second electrode to form a nanotube layer. For example, the mixture of CNTs and BNNTs in the liquid solution is deposited on the first and second electrodes, for example, using a pipette or a suitable machine. The CNT/BNNT mixture may then be artificially or naturally dried to form the nanotube layer.

In step 610, a housing configured to protect the sensor from light is formed. The components (e.g., CNTs) of the sensor are sensitive to light. Thus, the component and/or the sensor itself may be kept isolated from light and major environmental changes.

In embodiments, the resistive sensor described herein may be utilized individually or in combination with other sensors, for example, in an array of sensors or in a detector system or an electronic nose.

Figure 7:
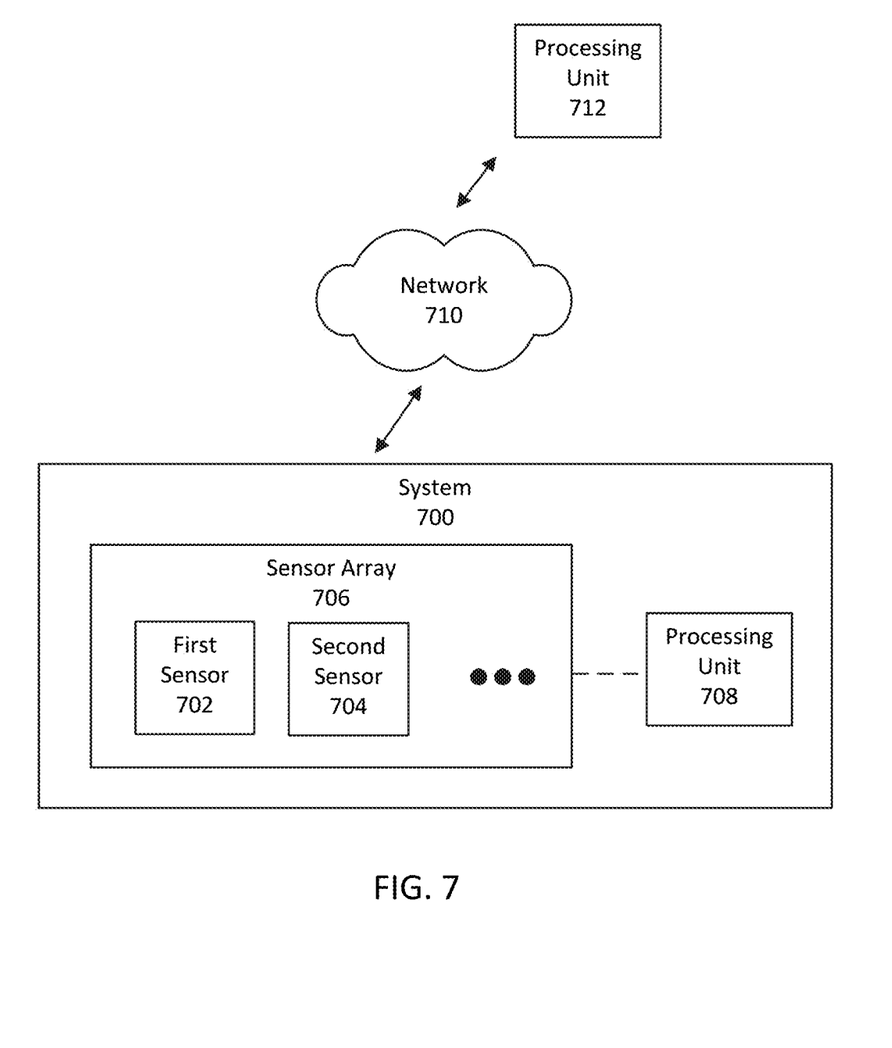
FIG. 7 illustrates a radiation detector system, in accordance with an example embodiment.

FIG. 7 illustrates one embodiment of a radiation detector system 700. System 700 may include a sensor array 706 that is communicatively coupled with one or more processing units, such as processing unit 708 and processing unit 712. As shown in FIG. 7, processing unit 708 may be directly coupled with sensor array 706, whereas communication between processing unit 712 and sensor array 706 may be made via a network 710.

Sensor array 706 may include one or more of the sensors described herein. The sensors may be the same or different and they may be integrated together in one unit or they may be arranged in a distributed manner. Each of processing unit 708 and processing unit 712 may be implemented in one or more physical hardware electrical circuit device elements and/or integrated circuit device as a central processing unit, a microcontroller, a microprocessor, etc. Processing unit 708 and processing unit 712 may execute program code stored in a computer readable medium, such as program code of an operating system, an application program, and other programs (e.g., Elegoo MEGA 2560 software program).

System 700 may be connected to network 710 (e.g., the Internet) through an adaptor or network interface, a modem, or other means for establishing communications over the network. System 700 may include other components not shown in FIG. 7, for example, memory, program modules stored on the memory, storage devices, input devices, display or other output devices. In addition, a device for collecting sensor signals (e.g., measuring resistance values), may also be included. Thus, embodiments described herein may be implemented in hardware, or hardware (e.g., Elegoo MEGA 2560 board capable of executing simple commands and may rapidly and continuously monitor sensor data) combined with software and/or firmware.

By combining detection materials as described herein, a detector system (e.g., system 700) analogous in principle of operation as the human nose may be built. By identifying and selecting effective detection materials, sensors may be built to identify fissile materials or other sources of radiation. The combination of these detection materials and computing power with the ability to recognize source spectra may lead to a full electronic nose. For example, an accurate characterization of each material's response to irradiation may be determined. Then, the radiation (e.g., neutron, gamma) source spectra of various sources may be programmed into a processing unit, which may be configured to compare a detection event to a library or lookup table to determine radiation sources.

Embodiments are not limited to radiation sources. Chips may be fabricated using the techniques described herein to be implemented as toxic gas or biological agent detectors, forming an even wider spectrum detectors that are more robust with compact detection capabilities for use across many fields.

6. Experiment

Figure 8:
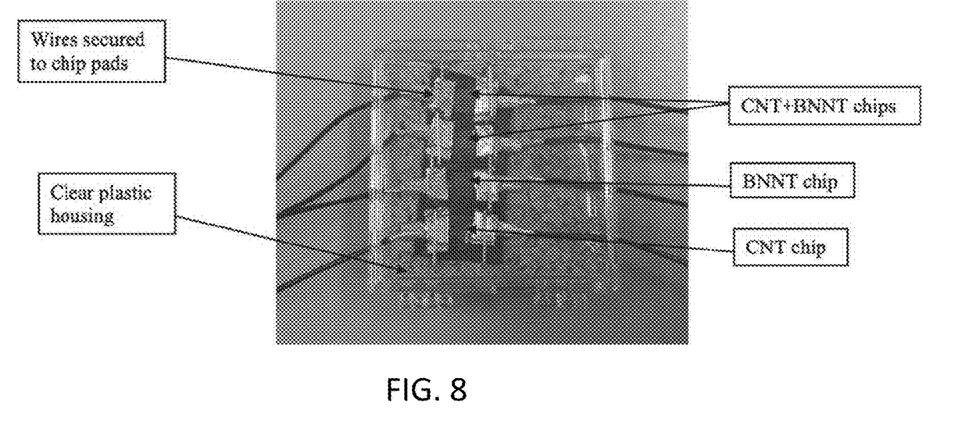
FIG. 8 illustrates a sensor housing that was used in an experiment.

FIG. 8 illustrates a sensor housing that was used in an experiment. In an example experiment to illustrate the functionality of the neutron sensor described herein, four separate sensors chips, with three different nanotube mixtures across them, are placed in one clear plastic housing mostly opaque to IR radiation. Two sensor chips contain a mixture of CNTs and BNNTs, the third sensor chip includes only BNNTs, and the fourth sensor chip includes only CNTs. Wires may be secured to the chip pads with conductive means (e.g., tape or staples) rather than probing the chips directly with an instrument. An array of sensors may be used. For example, twenty sensors, all shielded from ambient light with a cardboard box, was utilized in this experiment. The array of sensors may be irradiated with a neutron source. A nuclear reaction may be utilized to construct a neutron source by mixing a radioisotope that emits α particles (e.g., radium, polonium, or americium) with any low-atomic-weight isotope (e.g., beryllium, carbon, oxygen), such as by blending them. In this experiment, plutonium-beryllium (PuBe) was used as the neutron source. The PuBe source was moderated by 10 centimeters of high density polyethylene in order to maximize the fluence of neutrons in the thermal energy regime. A separate neutron detector may be utilized to measure the array of sensors' neutron fluence exposure.

Run 1: Ten-Minute Exposures to PuBe Source

Several runs of the experiment were conducted. In run 1, the sensor array was exposed to the PuBe source in three ten-minute doses. After the first ten minutes, eight of the ten BNNT and CNT sensors' resistance increased, as expected. The BNNT-only sensors had resistance values too high to measure to start with and remained too high to measure after the first exposure. No change was detected in the CNT-only sensors after the first exposure. The measurements did not change after either of the subsequent two iterations of the ten-minute exposures. Throughout the 30 minutes, only the BNNT and CNT sensors showed a definitive increase in resistance and the CNT chips showed no change. Thus, the change in resistance may be due to the neutron radiation. Moreover, because no subsequent changes were detected after the second and third exposures, the sensor materials were likely saturated during the first exposure. Table 1 below provides resistance measurements throughout the third iteration for the eight chips with changing resistance.

TABLE 1

Resistance Measurements from Sensors for Iteration 3

| Chip Name | Average pre-radiation resistance (Ohms) | Standard deviation (Ohms) | Resistance Post-Exposure (Ohms) | | | | | |
|---|---|---|---|---|---|---|---|---|
| | | | 0 minutes | 10 minutes | 20 minutes | 30 minutes | 30 minutes + 10 Gamma | 100 minutes rest |
| A1 | 39.50 | 0.15 | 39.7 | 40.3 | 40.3 | 40.3 | 40.3 | 40.2 |
| B1 | 777.00 | 48.86 | 8.31 | 953 | 940 | 938 | 938 | 937 |
| E1 | 415.00 | 12.36 | 4.34 | 443.5 | 443.6 | 444 | 444.5 | 443 |
| F1 | 5064.50 | 651.30 | 48.39 | 5483 | 5492 | 5495 | 5490 | 5456 |
| F2 | 2857.30 | 233.94 | 3105 | 3483 | 3486 | 3485 | 3483 | 3463 |
| G1 | 408.70 | 1.22 | 417 | 489.6 | 491 | 491 | 491 | 490 |
| G2 | 1223.50 | 2.59 | 131.5 | 2285 | 2289 | 2293 | 2292 | 2285 |
| I1 | 1695.50 | 24.43 | 1739 | 2737 | 2739 | 2740 | 2744 | 2740 |

Run 2: High-Energy Gamma Exposure

As noted in equations 1 and 2, the three products from the decay of the boron-10 (n,α) capture reaction are a lithium ion, an α particle, and a high-energy gamma ray (~1 MeV). In order to verify that the energetic lithium ions and α particles were the principle contributors of resistance increase via the destruction of C—C bonds, the sensors were exposed to cobalt. In the cobalt decay process, gamma rays are produced from cobalt-60 are also approximately 1 MeV, making it a good source for verification. Following ten minutes of gamma ray exposure, no change in resistance occurred, thereby confirming that gamma radiation was not a large contributor to the changes in resistance seen in Run 1.

Final Measurement

Final measurement was completed after the sensor chips had not been exposed to light or any form of nuclear radiation for three hours. This measurement was taken to determine if the changes seen in Run 1 were permanent. Table 2 and FIG. 7 both show that the change in resistance obtained after the first ten minutes remained constant even after the post-exposure three-hour rest period.

TABLE 2

Final Resistance Measurement from Sensors

| Chip Name | Average pre-radiation resistance (Ohms) | Standard deviation (Ohms) | Resistance Post-Exposure (Ohms) | | | | | |
|---|---|---|---|---|---|---|---|---|
| | | | 0 minutes | 10 minutes | 20 minutes | 30 minutes | 30 minutes + 10 Gamma | 100 minutes rest |
| A1 | 39.50 | 0.15 | 39.7 | 40.3 | 40.3 | 40.3 | 40.3 | 40.2 |
| B1 | 777.00 | 48.86 | 831 | 953 | 940 | 938 | 938 | 937 |
| E1 | 415.00 | 12.36 | 4.34 | 443.5 | 443.6 | 444 | 444.5 | 443 |
| F1 | 5064.50 | 651.30 | 4830 | 5483 | 5492 | 5495 | 5490 | 5450 |
| F2 | 2857.30 | 333.94 | 3105 | 3483 | 3486 | 3485 | 3483 | 3463 |
| G1 | 408.70 | 1.22 | 417 | 489.6 | 491 | 491 | 491 | 490 |
| G2 | 1323.50 | 2.59 | 1315 | 2285 | 2289 | 2292 | 2292 | 2285 |
| I1 | 1695.50 | 24.43 | 1739 | 2737 | 2739 | 2740 | 2744 | 2740 |

Figure 9:
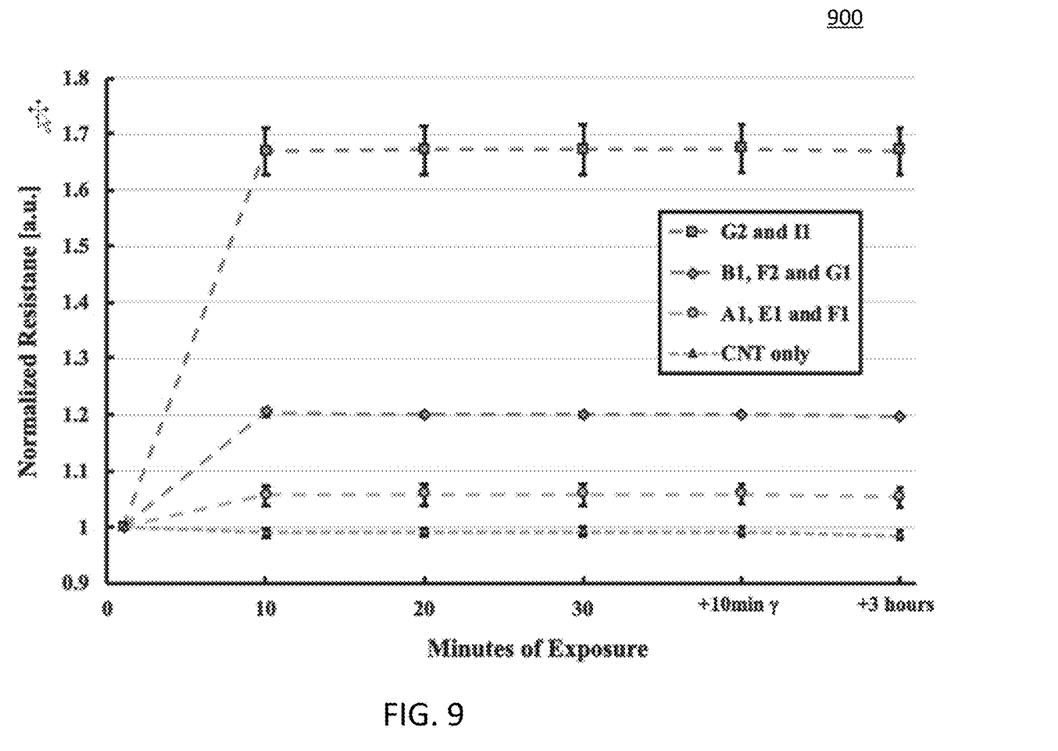
FIG. 9 is a graph showing the resistance measurement for several sensors after radiation exposure.

FIG. 9 is a graph 900 showing the resistance measurement for several sensors after radiation exposure. Graph 700 shows results that have been averaged and normalized Table 2. The eight BNNT and CNT sensor chips that showed an increase in resistance are naturally grouped into three categories, chips with resistance increases of ~68% (G2 and I1), ~20% (B1, F2 and G1), and ~8% (A1, E1, and F1). The chips are shown with their respective groups in graph 9. In graph 900, the zero-minute mark is the normalized (to one) initial resistance of the sensor chips. The line with triangle markers shows the response of the CNT-only sensor chips, displaying their lack of change throughout the entire experiment.

As can be seen from the results of the experiment, boron-10 enriched BNNTs in combination with CNTs over electrodes on an insulating substrate provide a feasible thermal neutron detector. Thus, a sensor using the CNTs and enriched BNNTs may be used as a receptor for an electronic nose. Multiple sensors built using different detection materials may be used in combination to make the electronic nose more robust and applicable across many fields.

The experiment above also confirmed that the resistive sensors were saturated within the first ten minutes of radiation exposure. Each boron-10 (n,α) capture reaction and subsequent emission of high-energy particles occurs in fractions of a second, so the detection of the neutron radiation may have to be a very fast measurement. Thus, in embodiments, real-time measurement tools may be used for such fast measurement on a periodic or continuous basis. The resistive sensors may be disposable sensors because they may be built and deployed at a large scale and a low cost.

In embodiments, different moderating materials may be utilized to precisely identify the exact fluence of neutrons of a specific energy when using a particular neutron source (e.g., PuBe) and layers of moderating polyethylene. For example, sensors may be exposed to the PuBe source using different moderating materials to change the energy spectrum which may categorize the effectiveness of the sensors across a wider range of neutron energies. This may allow for the characterization of response to neutron radiation at various energy levels. After an effective amount of moderation material is identified, polyethylene or another, possibly denser, material maybe incorporated into the housing of the sensor chip itself, ensuring its portability and effectiveness.

This description provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure.

It is to be understood that the above-described arrangements are only illustrative of the application of the principles of the present invention and it is not intended to be exhaustive or limit the invention to the precise form disclosed. Numerous modifications and alternative arrangements may be devised by those skilled in the art in light of the above teachings without departing from the spirit and scope of the present invention.

What is claimed is:

1. A detector system, comprising:
a first sensor that is disposable, the first sensor comprising:
a first electrode;
a second electrode; and
a nanotube layer deposited on the first electrode and the second electrode, the nanotube layer comprising a first nanotube type configured to provide an electrical pathway between the first electrode, and a second nanotube type configured to detect a first type of radiation; and
a second sensor configured to detect a second type of radiation that is different from the first type of radiation, wherein the second sensor is disposable.

2. The detector system of claim 1, wherein the first nanotube type comprises carbon nanotube and the second nanotube type comprises enriched boron nitride nanotube.

3. The detector system of claim 1, wherein the second nanotube type is higher in concentration than the first nanotube type.

4. The detector system of claim 1, wherein the second nanotube type is configured to detect thermal neutron radiation.

5. The detector system of claim 1, further comprising a housing configured to protect the sensor from light.

6. A radiation detector system, comprising:
a first sensor configured to detect a first type of radiation, the first sensor comprising
a first electrode,
a second electrode, and
a nanotube layer deposited on the first electrode and the second electrode,
wherein the first sensor is disposable;
a processing unit communicatively coupled to the first sensor, the processing unit configured to receive data from the sensor and determine radiation information based on the received data; and
a second sensor configured to detect a second type of radiation that is different from the first type of radiation, wherein the second sensor is disposable.

7. The radiation detector system of claim 6, wherein the nanotube layer comprises a first nanotube type configured to provide an electrical pathway between the first electrode, and a second nanotube type configured to detect the first type of radiation.

8. The radiation detector system of claim 7, wherein the first nanotube type comprises carbon nanotube and the second nanotube type comprises enriched boron nitride nanotube.

9. The radiation detector system of claim 7, wherein the second nanotube type is higher in concentration than the first nanotube type.

10. The radiation detector system of claim 6, wherein the first type of radiation comprises thermal neutron radiation.

11. The radiation detector system of claim 6, further comprising a housing configured to protect the first sensor from light.

* * * * *